(12) United States Patent
Lee

(10) Patent No.: US 12,297,834 B2
(45) Date of Patent: May 13, 2025

(54) INVERTER MANUFACTURING EQUIPMENT

(71) Applicant: Hanon Systems, Daejeon (KR)

(72) Inventor: Jae Chul Lee, Daejeon (KR)

(73) Assignee: HANON SYSTEMS, Daejeon (KR)

( * ) Notice: Subject to any disclaimer, the term of this patent is extended or adjusted under 35 U.S.C. 154(b) by 428 days.

(21) Appl. No.: 17/753,066

(22) PCT Filed: Jan. 27, 2021

(86) PCT No.: PCT/KR2021/001096
§ 371 (c)(1),
(2) Date: Feb. 17, 2022

(87) PCT Pub. No.: WO2021/153992
PCT Pub. Date: Aug. 5, 2021

(65) Prior Publication Data
US 2022/0333600 A1 Oct. 20, 2022

(30) Foreign Application Priority Data

Jan. 31, 2020 (KR) .................. 10-2020-0011960
Jan. 20, 2021 (KR) .................. 10-2021-0008279

(51) Int. Cl.
*F04C 29/04* (2006.01)
*F04C 18/02* (2006.01)
(Continued)

(52) U.S. Cl.
CPC ...... *F04C 29/0085* (2013.01); *F04C 18/0215* (2013.01); *F04C 29/047* (2013.01);
(Continued)

(58) Field of Classification Search
CPC .............. F04C 29/0085; F04C 18/0215; F04C 2240/803; F04C 2240/808; H02K 7/14; H02K 11/33; H05K 7/20; Y10T 29/53265
See application file for complete search history.

(56) References Cited

U.S. PATENT DOCUMENTS

2020/0166034 A1* 5/2020 Song ................ F04C 2240/008

FOREIGN PATENT DOCUMENTS

| CN | 105317655 A | 2/2016 |
|----|-------------|--------|
| JP | 2011155207 A | 8/2011 |

(Continued)

OTHER PUBLICATIONS

Seong et al., "Integrated Motor-Inverter Power Module for Electric Compressor (E-Compressor) in 48V Mild Hybrid Vehicles," 2018 IEEE Energy Conversion Congress and Exposition (ECCE), Portland, OR, USA, 2018, pp. 4659-4663. (Year: 2018).*

(Continued)

*Primary Examiner* — A. Dexter Tugbang
(74) *Attorney, Agent, or Firm* — Shumaker, Loop & Kendrick, LLP; James D. Miller

(57) ABSTRACT

An inverter manufacturing equipment to prevent soldering defects and damage to elements, wherein an inverter includes a first dummy plate fixed to a frame of an inverter having a circuit board on which a plurality of elements are mounted and the frame coupled to the circuit board, wherein the frame includes a support plate, a side plate projecting from the support plate toward the circuit board, an array plate on which switching elements connected to the circuit board are arranged, and a connection bar connecting the support plate and the array plate.

6 Claims, 12 Drawing Sheets

(51) Int. Cl.
    *F04C 29/00*     (2006.01)
    *H02K 7/14*      (2006.01)
    *H02K 11/33*     (2016.01)
    *H05K 7/20*      (2006.01)

(52) U.S. Cl.
    CPC ............... *H02K 7/14* (2013.01); *H02K 11/33* (2016.01); *H05K 7/20* (2013.01); *F04C 2240/803* (2013.01); *F04C 2240/808* (2013.01); *Y10T 29/53265* (2015.01)

(56) References Cited

FOREIGN PATENT DOCUMENTS

| | | |
|---|---|---|
| JP | 2014131445 A | 7/2014 |
| JP | 2016160824 A * | 9/2016 |
| JP | 6065973 B2 | 1/2017 |
| JP | 2017208436 A | 11/2017 |
| JP | 2019195252 A | 11/2019 |
| JP | 2019195262 A | 11/2019 |
| KR | 20160104397 A | 9/2016 |
| KR | 101935283 B1 | 1/2019 |
| WO | 2019064896 A1 | 4/2019 |

OTHER PUBLICATIONS

Machine Translation of Japanese Patent Publication, JP 2014-131445, Nov. 2024. (Year: 2024).*

* cited by examiner

INVERTER MANUFACTURING EQUIPMENT

CROSS-REFERENCE TO RELATED PATENT APPLICATIONS

This patent application is a United States national phase patent application based on PCT/KR2021/001096 filed on Jan. 27, 2021, which claims the benefit of Korean Patent Application No. 10 2020 0011960 filed on Jan. 31, 2020 and Korean Patent Application No. 10 2021 0008279 filed on Jan. 20, 2021, the entire disclosures of which are hereby incorporated herein by reference.

TECHNICAL FIELD

The present disclosure relates to an electric compressor, an inverter manufacturing equipment and an inverter manufacturing method, and more particularly, to an electric compressor, an inverter manufacturing equipment and an inverter manufacturing method capable of preventing detachment and damage of elements when soldering an inverter of an electric compressor.

BACKGROUND ART

In general, a compressor used in an air conditioning system of a vehicle performs a function of sucking a refrigerant that has been evaporated from an evaporator, making it a high temperature and high-pressure state that is easy to liquefy, and transferring it to a condenser.

Such compressors are divided into a mechanical compressor for performing a compression operation by receiving a driving force from an engine of a vehicle and an electric compressor for performing a compression operation by driving an electric motor (hereinafter referred to as a motor) according to a separate power supply, and in the case of the electric compressor, cooling efficiency is variably adjusted while the rotational speed and torque of the motor are adjusted.

Looking more specifically for the electric compressor, the conventional electric compressor includes a motor for generating power, a compression mechanism for compressing refrigerant by receiving power from the motor, and an inverter for controlling the motor.

Here, the inverter includes a circuit board on which a plurality of elements are mounted and a frame on which a switching element is disposed and coupled to the circuit board, the plurality of elements are arranged on the circuit board, the frame is assembled on the circuit board and mounted on a pallet that is an inverter manufacturing equipment, and the element is soldered by, for example, a selective soldering method.

However, in the conventional electric compressor, inverter manufacturing equipment, and inverter manufacturing method, the plurality of elements are not fixed before the soldering process, so that they are separated from a predetermined position, thereby causing soldering defects.

In addition, the switching element, which is vulnerable to heat, is damaged by the heat caused by soldering.

In addition, the inverter is damaged by heat of the switching element when inspecting whether the plurality of elements and the switching element operate normally after soldering.

In addition, since stress applied to the plurality of elements and the switching element during soldering and stress applied to the plurality of elements and the switching element after the inverter is mounted on the electric compressor are different, after the inverter is mounted on the electric compressor, damage occurs in the soldered portions of the plurality of elements.

SUMMARY

Accordingly, an object of the present disclosure is to provide an electric compressor, an inverter manufacturing equipment and an inverter manufacturing method capable of preventing soldering defects by preventing a plurality of elements from being separated from a predetermined position.

Another object of the present disclosure is to provide an electric compressor, an inverter manufacturing equipment, and an inverter manufacturing method that may prevent a switching element from being damaged by heat due to soldering.

In addition, another object of the present disclosure is to provide an electric compressor, inverter manufacturing equipment, and an inverter manufacturing method that may prevent an inverter from being damaged by heat of a switching element when inspecting whether a plurality of elements and the switching element operate normally after soldering.

In addition, another object of the present disclosure is an electric compressor, an inverter manufacturing equipment and an inverter manufacturing method capable of preventing damage to soldered portions of a plurality of elements after an inverter is mounted on the electric compressor due to difference in stress applied to the plurality of elements and a switching element.

In order to achieve the object as described above, the present disclosure provides an electric compressor including a housing; a motor provided inside the housing; a compression mechanism receiving power from the motor and compressing refrigerant; and an inverter controlling the motor, wherein the inverter includes a circuit board on which a plurality of elements are mounted and a frame coupled to the circuit board, and wherein the frame includes a support plate, a side plate protruding from the support plate toward the circuit board, an array plate on which a switching element connected to the circuit board is arranged, and a connection bar connecting the support plate and the array plate.

A fastening hole coupled to the housing may be formed on the side plate.

The support plate and the array plate may be formed to be spaced apart from each other, one end of the connection bar may be connected to the support plate, and the other end of the connection bar may be connected to the array plate.

The connection bar may be formed in plurality, and the plurality of connection bars may be arranged along the outer periphery of the array plate.

The support plate may include a filter receiving portion in which a filter element 141a is disposed, and one end of one of the plurality of connection bars may be connected to the filter receiving portion of the support plate and the other end may be connected to the array plate.

The connection bar may be formed so that the array plate is capable of relative movement in a direction away from and closer to the circuit board with respect to the support plate.

The array plate may include a partition wall that surrounds the switching element and protrudes in a thickness direction of the switching element.

The switching element may be formed in plurality, and the plurality of switching elements may be arranged to face each other in a double row.

And, the present disclosure provides an inverter manufacturing equipment including a first dummy plate fixed to a frame of an inverter having a circuit board on which a plurality of elements of an electric compressor are mounted and the frame on which a switching element is disposed; and a second dummy plate coupled to the first dummy plate to contact the switching element and to fix and radiate the switching element and the plurality of elements.

The second dummy plate may include a heat proof plate, and the heat proof plate may be formed in contact with the switching element when the second dummy plate is coupled to the first dummy plate.

The frame may include a support plate, an array plate on which the switching element is arranged, and a connection bar connecting the support plate and the array plate, and the heat proof plate may be formed to change the relative position of the array plate with respect to the support plate by pressing the switching element when the second dummy plate is coupled to the first dummy plate, and is formed in close contact with the switching element by the restoring force of the connection bar.

The frame may include a fastening hole coupled to the housing, the first dummy plate may include a first base plate opposite to the circuit board and a first side plate bent from the first base plate and surrounding the outer periphery of the inverter, the first base plate may include a guide pin inserted into the fastening hole and an opening exposing the circuit board for soldering, and the first side plate may include a fixing hole into which a fixture for coupling with the second dummy plate is inserted.

The first side plate may further include a mounting hole into which a mounting pin for simultaneously soldering the plurality of inverters is inserted.

The second dummy plate may further include a second base plate opposite to the frame, a second side plate bent from the second base plate and coupled to the first side plate, and a heat sink installed on the second base plate and heat-exchangeable with the heat proof plate.

The switching element may be formed in plurality, the heat proof plate may be formed in the same number as the switching element, and the second dummy plate may include an insulating bracket that insulates the plurality of heat proof plates from each other.

The second dummy plate may include an insulating paper that insulates the heat sink from the plurality of heat proof plates.

And, the present disclosure provides an inverter manufacturing method including a first preparation step of inserting a guide pin of the inverter manufacturing equipment into a fastening hole of the frame and seating the inverter on the first dummy plate; a second preparation step of coupling the second dummy plate to the first dummy plate, fixing the elements of the inverter, and connecting the element to the heat proof plate of the second dummy plate; a soldering step of soldering the element; and a withdrawing step of withdrawing the inverter from the inverter manufacturing equipment.

The inverter manufacturing method may further include an inspection step of inspecting whether the element operates normally between the soldering step and the withdrawing step.

The inverter manufacturing method may further include a third preparation step of seating the assembly of the inverter and the inverter manufacturing equipment on a pallet between the second preparation step and the soldering step, in the soldering step, when a plurality of assemblies is seated on the pallet, the elements of the plurality of assemblies seated on the pallet may be simultaneously soldered.

In an electric compressor, an inverter manufacturing equipment and an inverter manufacturing method according to the present disclosure, an inverter of the electric compressor includes a circuit board on which a plurality of elements are mounted and a frame coupled to the circuit board, wherein the frame includes a support plate, a side plate protruding from the support plate toward the circuit board, an array plate on which a switching element connected to the circuit board is arranged, and a connection bar connecting the support plate and the array plate, the inverter manufacturing equipment includes a first dummy plate fixed to the frame, and a second dummy plate coupled to the first dummy plate to contact the switching element, fix the plurality of elements and the switching element, and radiate heat, the inverter manufacturing method includes seating the inverter on the first dummy plate, coupling the second dummy plate to the first dummy plate to fix the plurality of elements and the switching element, and connect the switching element to a heat proof plate of the second dummy plate, and soldering the plurality of elements, so as to prevent the plurality of elements from being separated from a predetermined position, thereby preventing soldering defects.

In addition, as heat applied to the plurality of elements and the switching element is radiated by the second dummy plate, it is possible to prevent the switching element from being damaged by heat due to soldering.

In addition, as the heat generated by the switching element is radiated by the second dummy plate, the inverter may be prevented from being damaged by the heat of the switching element when checking whether the plurality of elements and the switching element operate normally.

In addition, since the second dummy plate presses the inverter so that the same level of stress as when the inverter is mounted on the electric compressor is applied to the plurality of elements and the switching element even during soldering, it is possible to prevent damage to the soldered portions of the plurality of elements after the inverter is mounted on the electric compressor due to the difference in stress applied to the plurality of elements and the switching elements.

DETAILED DESCRIPTION OF AN EMBODIMENT

Hereinafter, an electric compressor, an inverter manufacturing equipment and an inverter manufacturing method according to the present disclosure will be described in detail with reference to the accompanying drawings.

Figure 1:
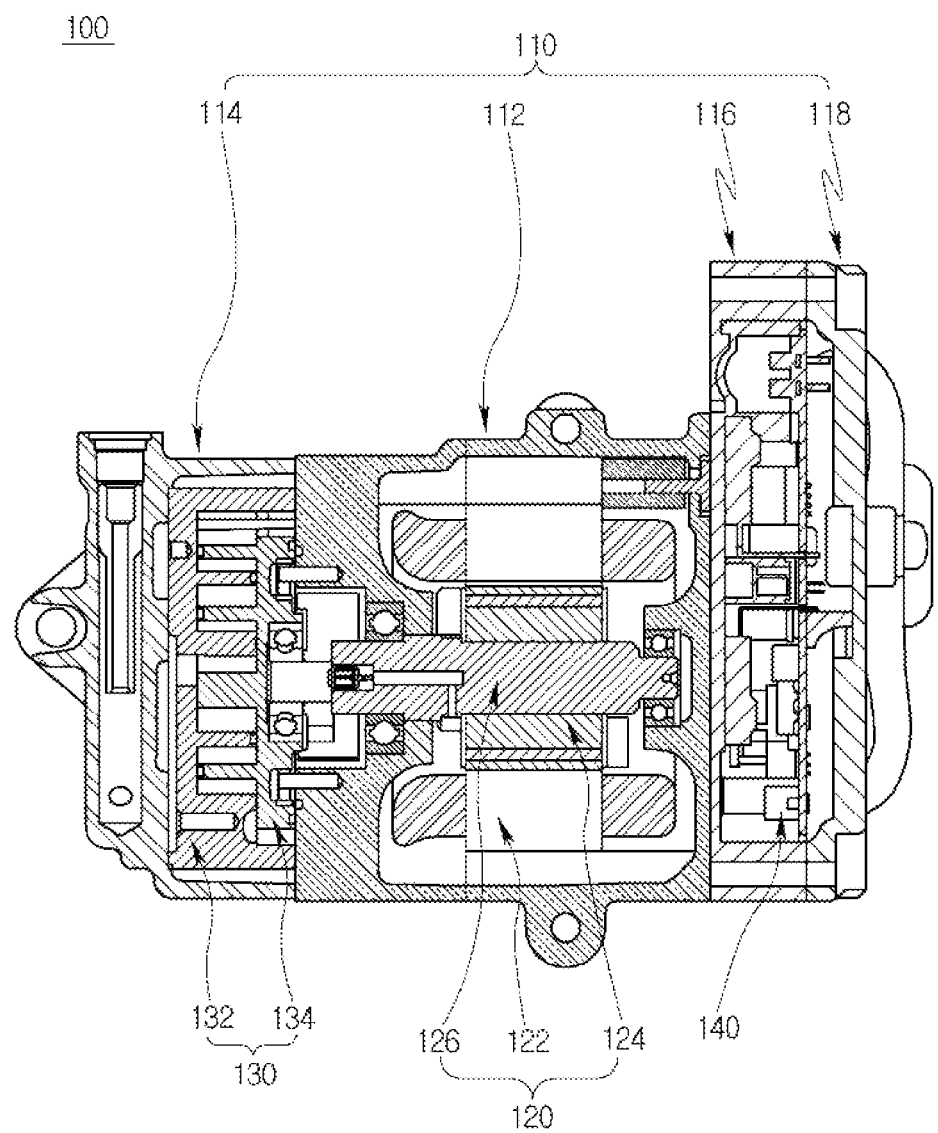
FIG. 1 is a cross-sectional view illustrating an electric compressor according to an embodiment of the present disclosure.
Figure 2:
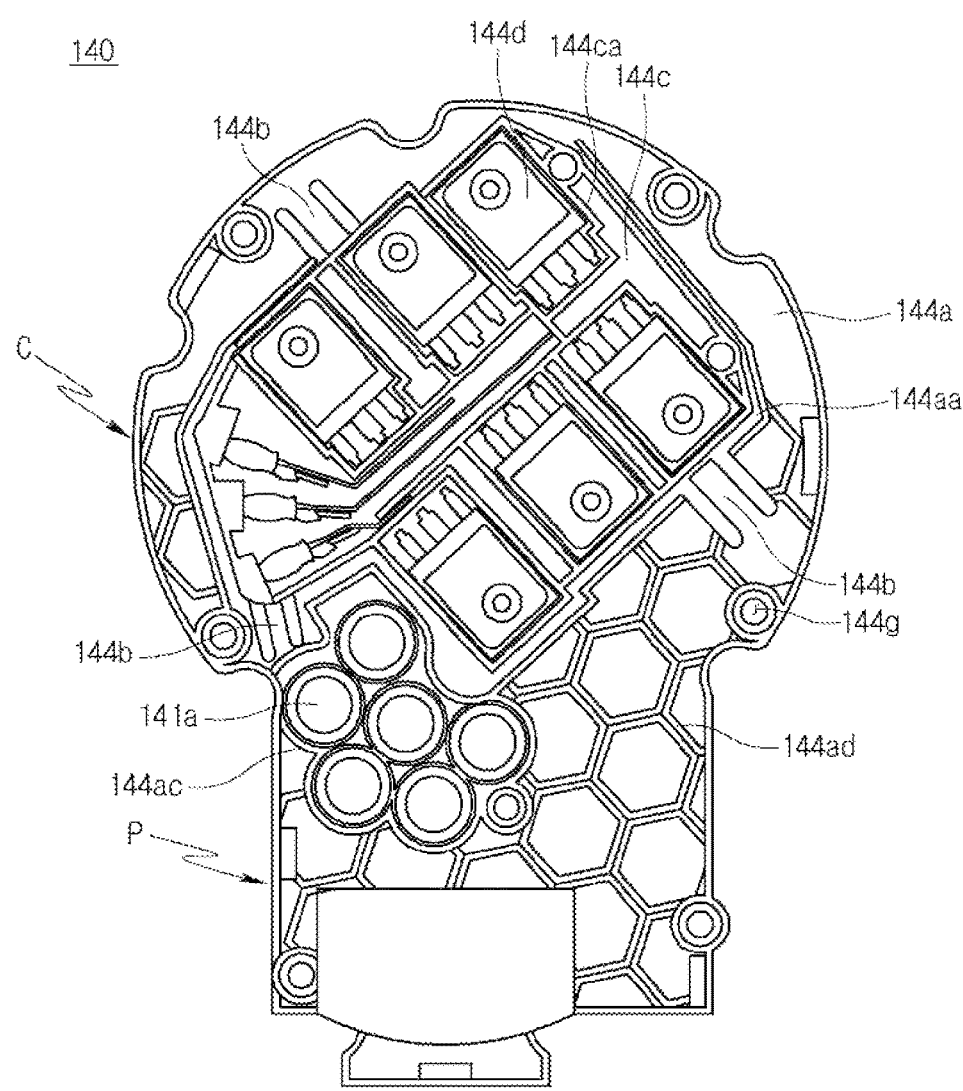
FIG. 2 is a plan view illustrating the inverter for the electric compressor of FIG. 1 from a frame side.
Figure 3:
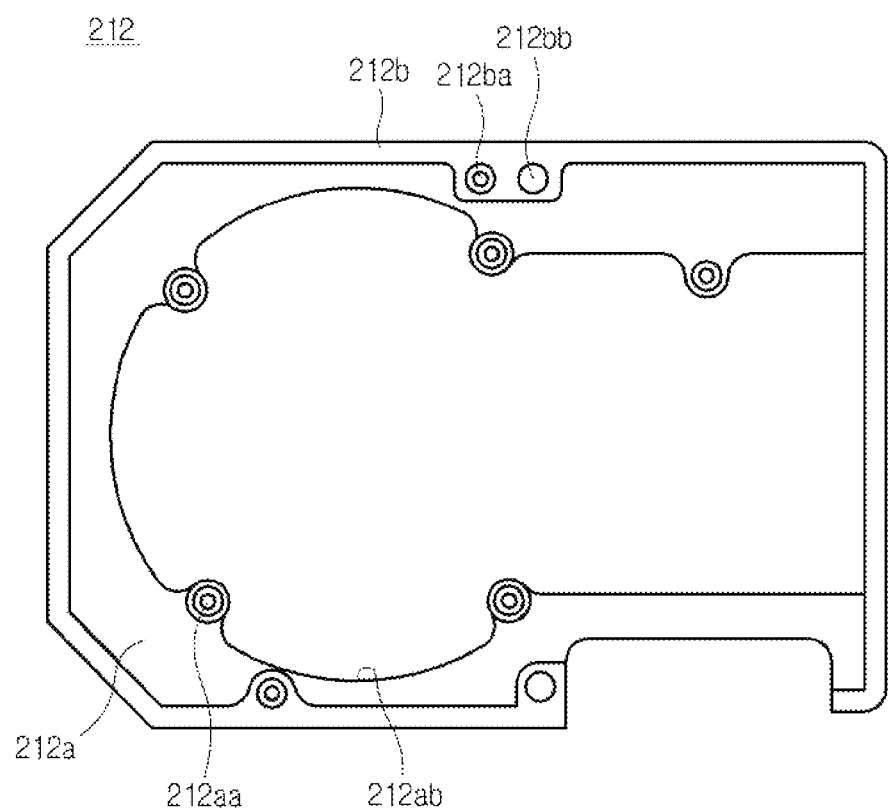
FIG. 3 is a front view illustrating a first dummy plate among inverter manufacturing equipment used to solder the inverter for the electric compressor of FIG. 1.
Figure 4:
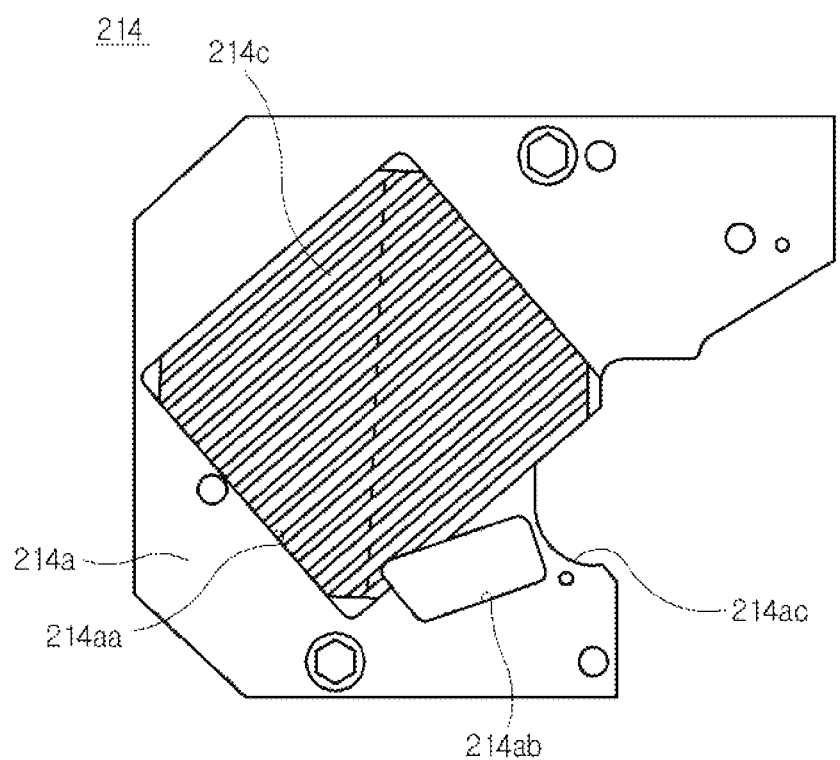
FIG. 4 is a front view illustrating a second dummy plate among inverter manufacturing equipment used to solder the inverter for the electric compressor of FIG. 1.
Figure 5:
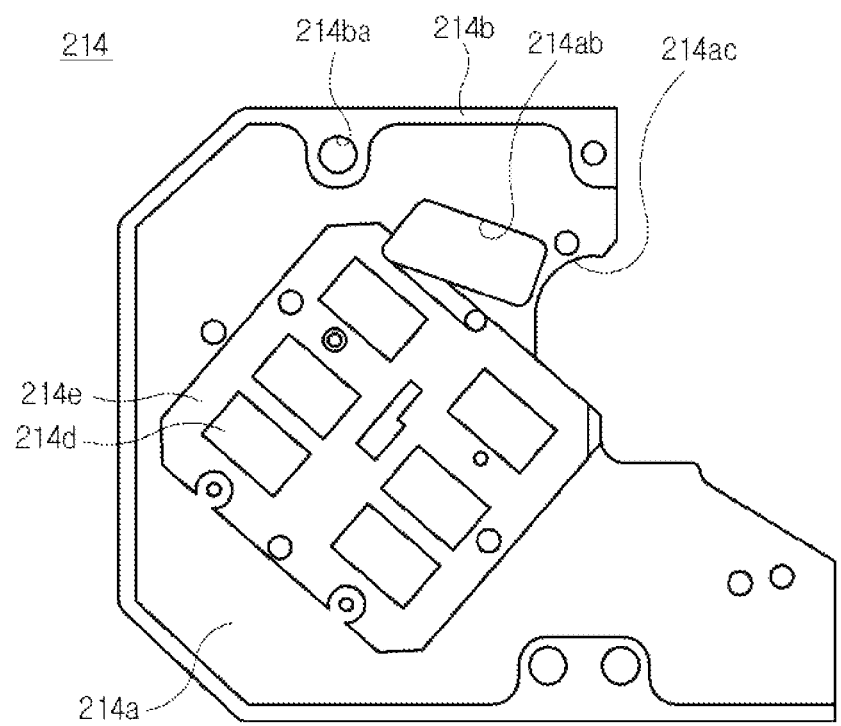
FIG. 5 is a rear view of FIG. 4.
Figure 6:
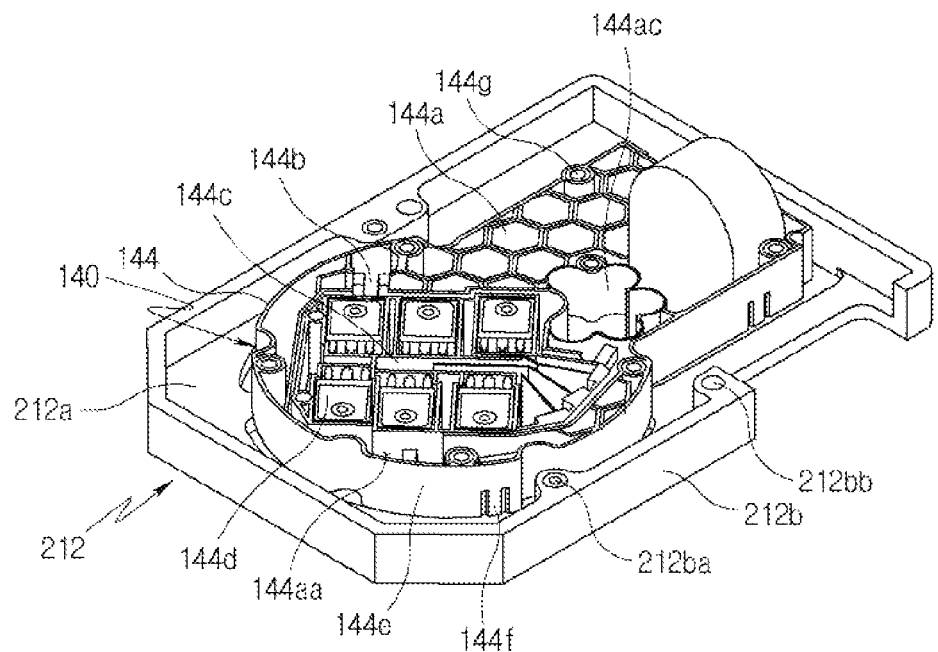
FIG. 6 is a perspective view illustrating a state in which the inverter for the electric compressor of FIG. 1 is seated on the first dummy plate of FIG. 3.
Figure 7:
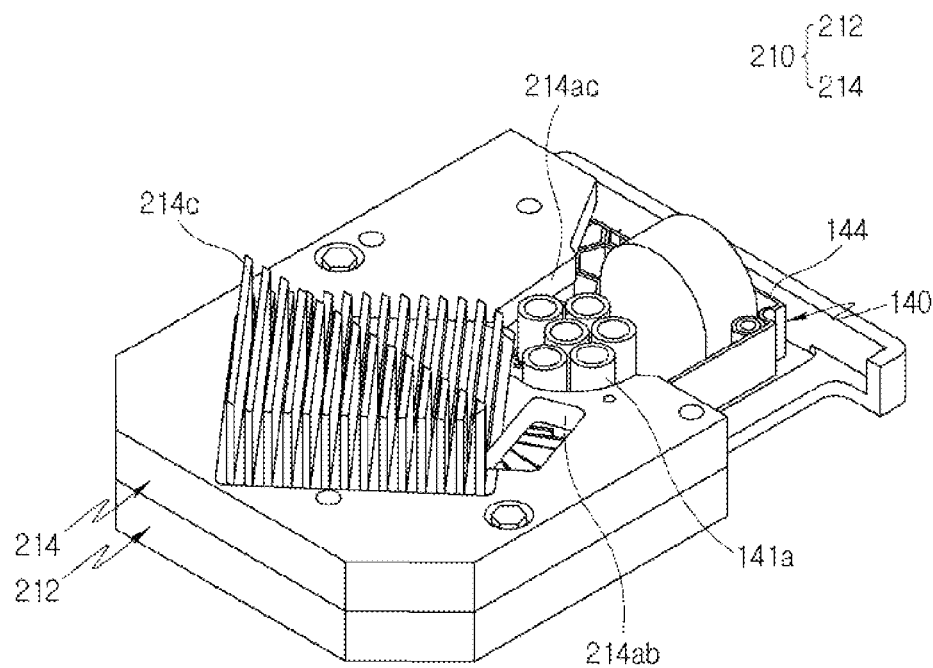
FIG. 7 is a perspective view illustrating a state in which the second dummy plate of FIGS. 4 and 5 is coupled to the first dummy plate on which the inverter of FIG. 6 is mounted.
Figure 8:
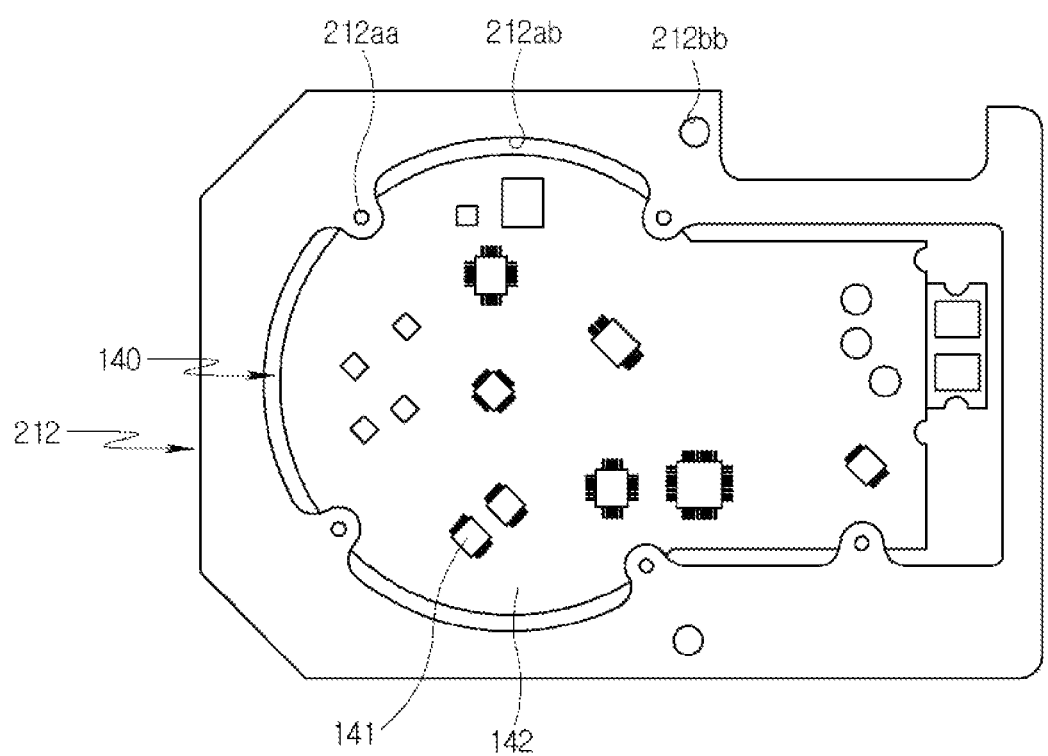
FIG. 8 is a bottom view of FIG. 7.

FIG. 1 is a cross-sectional view illustrating an electric compressor according to an embodiment of the present disclosure, FIG. 2 is a plan view illustrating the inverter for the electric compressor of FIG. 1 from a frame side, FIG. 3 is a front view illustrating a first dummy plate among inverter manufacturing equipment used to solder the inverter for the electric compressor of FIG. 1, FIG. 4 is a front view illustrating a second dummy plate among inverter manufacturing equipment used to solder the inverter for the electric compressor of FIG. 1, FIG. 5 is a rear view of FIG. 4, FIG. 6 is a perspective view illustrating a state in which the inverter for the electric compressor of FIG. 1 is seated on the first dummy plate of FIG. 3, FIG. 7 is a perspective view illustrating a state in which the second dummy plate of FIGS. 4 and 5 is coupled to the first dummy plate on which the inverter of FIG. 6 is mounted, FIG. 8 is a bottom view of FIG. 7, and FIGS. 9 to 14 are cross-sectional views schematically illustrating a process of soldering the inverter for the electric compressor of FIG. 1 using the inverter manufacturing equipment of FIGS. 3 to 5.

Figure 9:
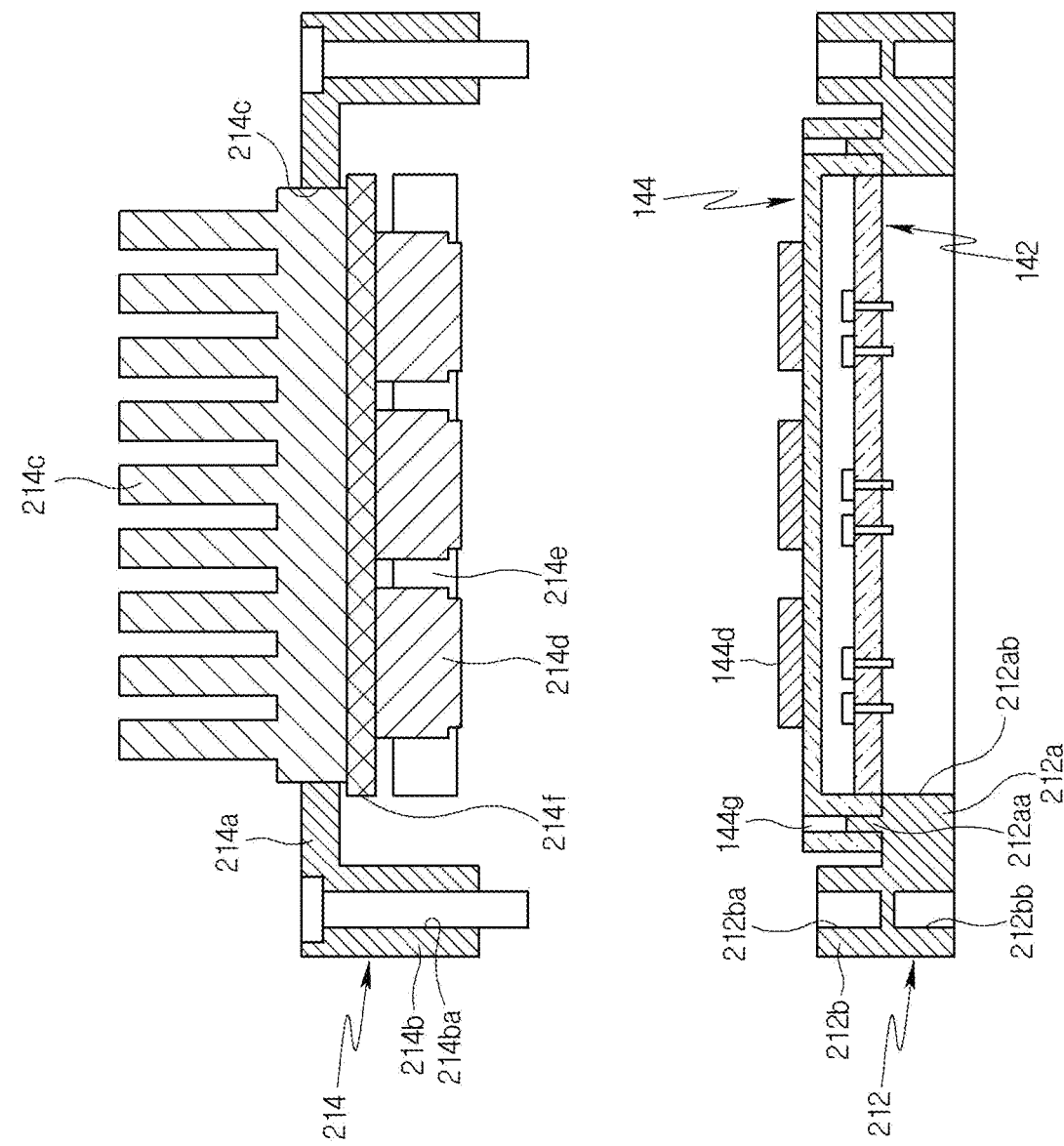
FIG. 9 is a cross-sectional view illustrating a step of seating the inverter on the first dummy plate during the process of soldering the inverter for the electric compressor of FIG. 1 using the inverter manufacturing equipment of FIGS. 3 to 5.
Figure 10:
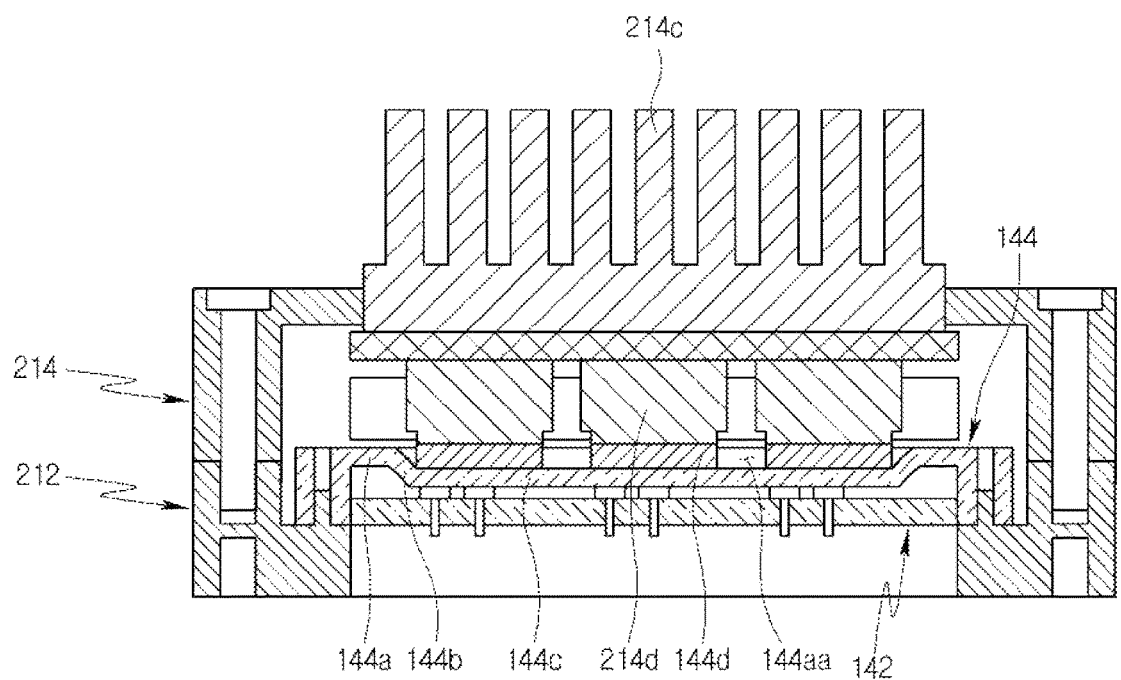
FIG. 10 is a cross-sectional view illustrating a step of coupling the second dummy plate to the first dummy plate as the next step of FIG. 9.
Figure 11:
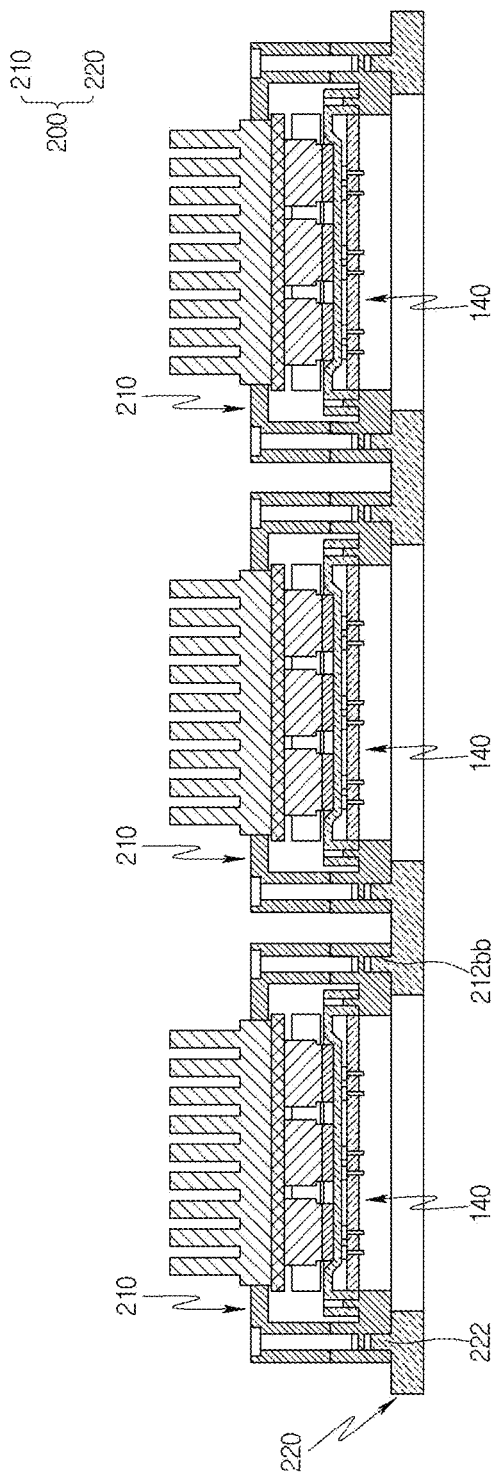
FIG. 11 is a cross-sectional view illustrating a step of seating a plurality of assemblies of inverter and inverter manufacturing equipment on a pellet as the next step of FIG. 10.
Figure 12:
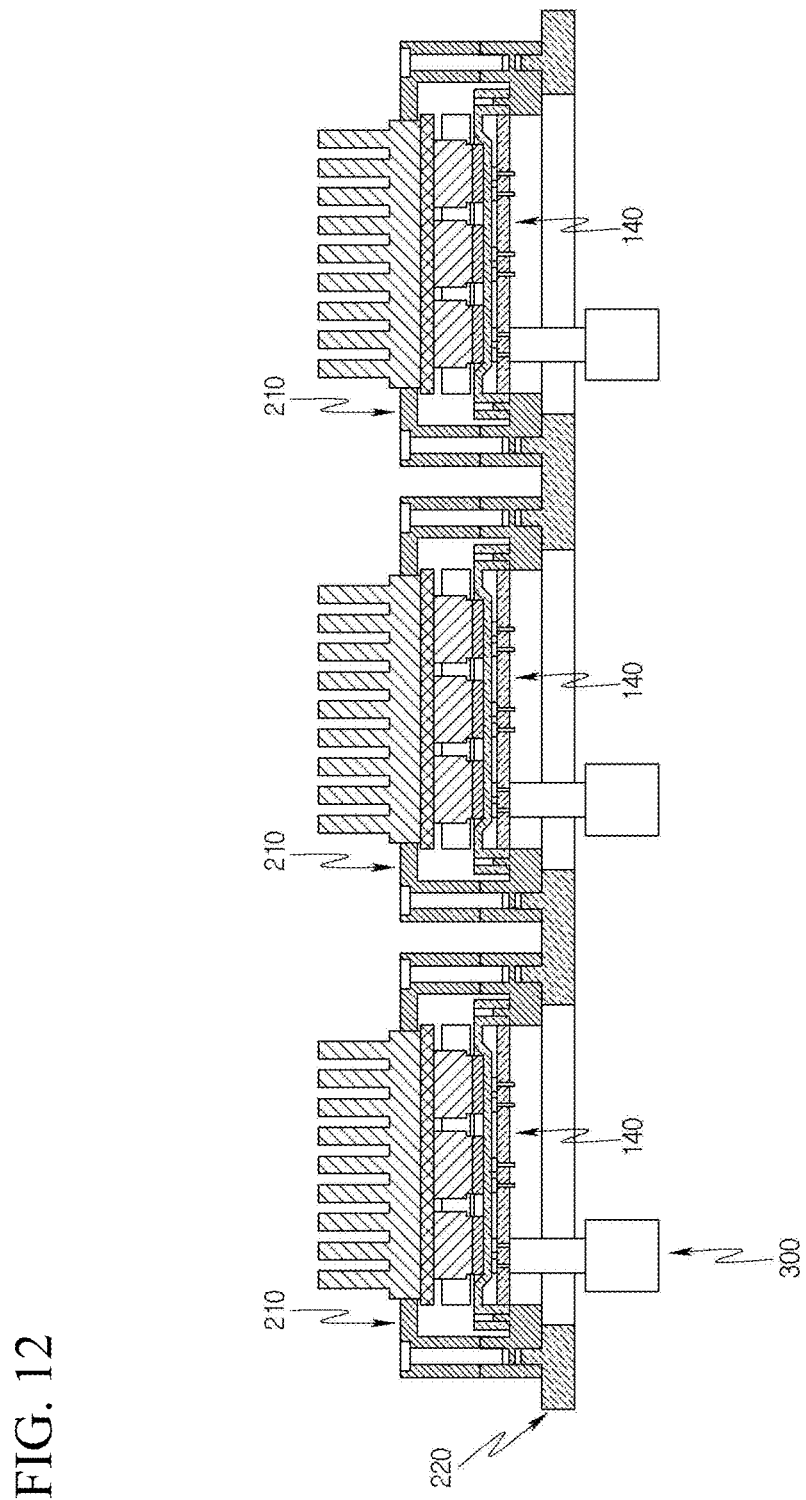
FIG. 12 is a cross-sectional view illustrating a step of soldering as the next step of FIG. 11.
Figure 13:
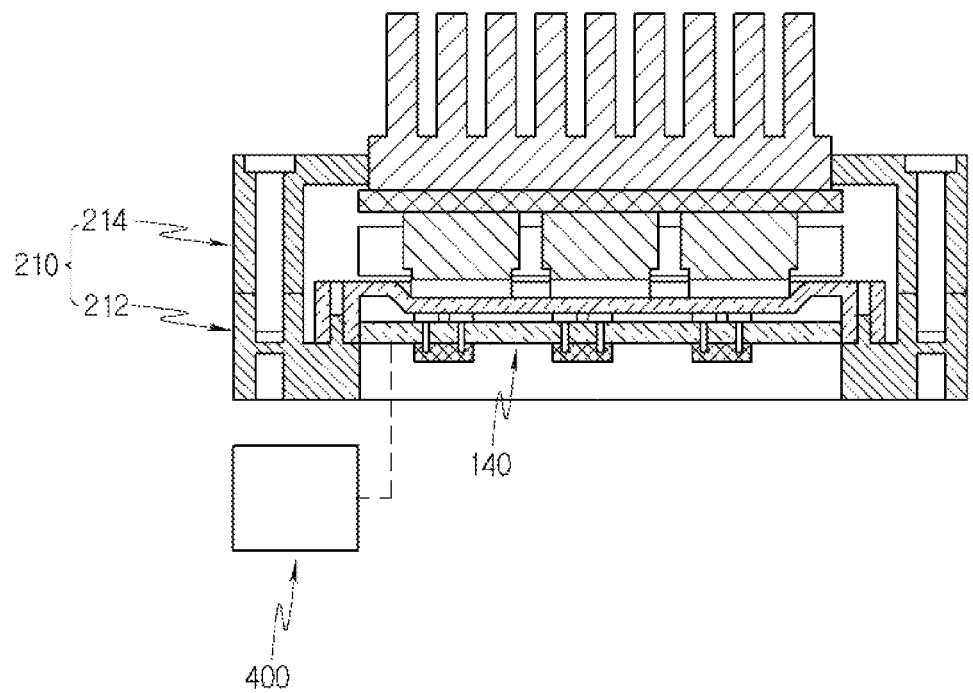
FIG. 13 is a cross-sectional view illustrating a step of inspecting whether the elements operate normally after withdrawing the assembly from the pellet as the next step of FIG. 12.
Figure 14:
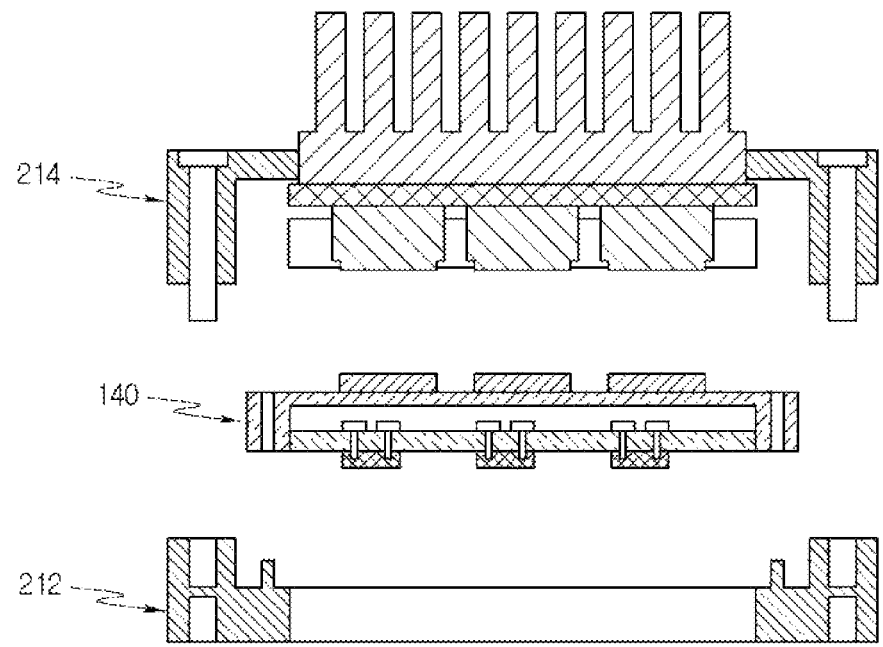
FIG. 14 is a cross-sectional view illustrating a step of withdrawing the inverter from the inverter manufacturing equipment as the next step of FIG. 13.

Here, FIG. 9 is a cross-sectional view illustrating a step of seating the inverter on the first dummy plate, FIG. 10 is a cross-sectional view illustrating a step of coupling the second dummy plate to the first dummy plate as the next step of FIG. 9, FIG. 11 is a cross-sectional view illustrating a step of seating a plurality of assemblies of inverter and inverter manufacturing equipment on a pellet as the next step of FIG. 10, FIG. 12 is a cross-sectional view illustrating a step of soldering as the next step of FIG. 11, FIG. 13 is a cross-sectional view illustrating a step of inspecting whether the elements operate normally after withdrawing the assembly from the pellet as the next step of FIG. 12, FIG. 14 is a cross-sectional view illustrating a step of withdrawing the inverter from the inverter manufacturing equipment as the next step of FIG. 13.

Referring to FIG. 1, an electric compressor 100 according to an embodiment of the present disclosure may include a housing 110, a motor 120 provided in an inner space of the housing 110 and generating power, a compression mechanism 130 receiving power from the motor 120 to compress refrigerant, and an inverter 140 controlling the motor 120.

The housing 110 may include a motor housing 112 having a motor accommodation space in which the motor 120 is accommodated, a front housing 114 coupled to one side of the motor housing 112 and receiving the compression mechanism 130, a rear housing 116 coupled to the other side of the motor housing 112 and receiving the inverter 140, and an inverter cover 118 coupled to the rear housing 116 and covering the inverter 140.

The motor 120 may include a stator 122 fixed to an inside of the motor housing 112, a rotor 124 positioned inside the stator 122 and rotated by interaction with the stator 122, and a rotating shaft 126 coupled to the rotor 124 and rotated together with the rotor 124.

The compression mechanism 130 may include a fixed scroll 132 fixedly installed and an orbiting scroll 134 engaged with the fixed scroll 132 to form a compression chamber and orbitally moved by the rotating shaft 126. Here, in the present embodiment, the compression mechanism 130 is formed in a so-called scroll type, but is not limited thereto, and may be formed in other types such as a reciprocating type, a vane rotary type, and the like.

Referring FIGS. 2 and 6 to 9, the inverter 140 may include a circuit board 142 on which a plurality of elements 141 necessary for inverter control are mounted and a frame 144 coupled to the circuit board 142.

Here, after the plurality of elements 141 are arranged on the circuit board 142 and the frame 144 is assembled to the circuit board 142, the plurality of elements 141 are soldered by, for example, a selective soldering method to form the inverter 140. Here, the inverter may be formed to prevent soldering defects and damage to the soldered element.

Specifically, referring to FIGS. 2 and 6, the frame 144 may include a disk portion C disposed at a position corresponding to a position where the motor 120 is provided and a protrusion portion P protruding from the disk portion C.

And, the frame 144 may include a support plate 144a facing the circuit board 142, an array plate 144c on which a switching element 144d (e.g., Insulated Gate Bipolar Transistor (IGBT), Intelligent Power Module (IPM), etc.) connected to the circuit board 142 is arranged, a connection bar 144b connecting the support plate 144a and the array plate 144c, and a side plate 144e protruding from the support plate 144a toward the circuit board 142.

The support plate 144a may be formed in both the disk portion C region and the protrusion portion P region.

In addition, a cutout 144aa in which the array plate 144c is accommodated may be formed in a central portion of the disk portion C region of the support plate 144a.

In addition, the support plate 144a may include a filter receiving portion 144ac in which a filter element 141a such as a capacitor is disposed, and the filter receiving portion 144ac may be disposed in the protrusion portion P region of the support plate 144a.

In addition, the support plate 144a may include a plurality of ribs 144ad for strength improvement, and the plurality of ribs 144ad may be formed in a honeycomb structure to maximize strength improvement.

The array plate 144c may be formed in a plate shape spaced apart from the support plate 144a while being accommodated in the cutout 144aa.

In addition, the array plate 144c may include a partition wall 144ca that surrounds the switching element 144d and protrudes in a thickness direction of the switching element 144d. Here, as the array plate 144c is formed in the disk portion C region disposed on the side of the motor in which low temperature suction refrigerant flows, it may smoothly radiate heat from the switching element 144d by using heat exchange between the switching element 144d with severe heat and the cold refrigerant in the motor housing.

The connection bar 144b may extend from the support plate 144a to the array plate 144c across a space between the support plate 144a and the array plate 144c. That is, one end of the connection bar 144b may be connected to the support plate 144a, and the other end of the connection bar 144b may be connected to the array plate 144c.

In addition, the connection bar 144b may be formed in plurality, and the plurality of connection bars 144b may be disposed along an outer periphery of the array plate 144c.

Here, one of the plurality of connection bars 144b may have one end connected to the filter receiving portion 144ac and the other end connected to the array plate 144c.

In addition, the connection bar 144b may be formed of an elastic material so that the array plate 144c may relatively move in a direction away from and closer to the circuit board 142 with respect to the support plate 144a.

A fastening hole 144g may be formed in an outer periphery of the side plate 144e, and a guide pin 212aa of an inverter manufacturing equipment 200 to be described later for fixing the inverter 140 may be inserted to the fastening hole when the plurality of elements 141 are soldered, and a fixture for coupling the inverter 140 to the housing 110 may be inserted into the fastening hole after the plurality of elements 141 are soldered. Here, the fastening hole 144g is formed in plurality so that the inverter 140 is stably fastened to the housing 110, and a guide pin 212aa to be described later may be formed in the same number as the plurality of fastening holes 144g so that the inverter 140 is stably supported by an inverter manufacturing equipment 200 to be described later.

The side plate 144e may include a hook 144f fastened to the circuit board 142, and the hook 144f may be formed by cutting a part of the side plate 144e. In addition, the hook 144f may be formed in plurality so that the circuit board 142 and the frame 144 are stably assembled, and the plurality of hooks 144f may be arranged along an outer periphery of the base plate.

Meanwhile, an inverter manufacturing equipment 200 according to this embodiment may include a first inverter manufacturing equipment 210 for fixing and radiating the plurality of elements 141 and the switching element 144d, and a second inverter manufacturing equipment 220 for mounting the first inverter manufacturing equipment 210.

Referring to FIGS. 3 to 8, the first inverter manufacturing equipment 210 may include a first dummy plate 212 coupled to the inverter 140, and a second dummy plate 214 coupled to the first dummy plate 212 to contact the switching element 144d, and fix and radiate the plurality of elements 141 and the switching element 144d.

The first dummy plate 212 may include a first base plate 212a facing the circuit board 142, and a first side plate 212b bent from the first base plate 212a and surrounding the outer periphery of the inverter 140.

The first base plate 212a may include a guide pin 212aa inserted into the fastening hole 144g, and an opening 212ab exposing the circuit board 142 for soldering.

The first side plate 212b may include a first fixing hole 212ba into which a fixture coupling the first dummy plate 212 and the second dummy plate 214 is inserted.

In addition, the first side plate 212b may further include a mounting hole 212bb into which a mounting pin 222 to be described later of the second inverter manufacturing equipment 220 is inserted.

The second dummy plate 214 may include a second base plate 214a opposite to the frame 144, a second side plate 214b bent from the second base plate 214a and coupled to the first side plate 212b, a heat sink 214c installed on the second base plate 214a, and a heat proof plate 214d capable of exchanging heat with the heat sink 214c.

The second base plate 214a may include a heat sink installation hole 214aa into which the heat sink 214c is inserted, a first interference avoiding hole 214ab for avoiding interference with an electrical pin for connecting the inverter 140 to a power source, and a second interference avoiding hole 214ac for avoiding interference with the filter element 141a and a coil.

The second side plate 214b may include a second fixing hole 214ba into which the fixture coupling the first dummy plate 212 and the second dummy plate 214 is inserted.

The heat sink 214c may be formed of a conductive material, and may be formed in the form of a heat dissipation fin penetrating the second base plate 214a. In addition, the heat sink 214c may include a low-height region and a high-height region as illustrated in FIG. 7 in order to avoid interference in the manufacturing process.

The heat proof plate 214d may be formed of a conductive material, and may be formed to contact while pressing the switching element 144d when the second dummy plate 214 is coupled to the first dummy plate 212.

Here, the heat proof plate 214d may be formed so that a degree to which the switching element 144d is pressed by the heat proof plate 214d and a degree to which the switching element 144d is pressed by the housing 110 after the inverter 140 is mounted on the housing 110 are equal to each other.

Meanwhile, the switching element 144d is formed in plurality, the plurality of switching elements 144d are arranged to face each other in a double row, the heat proof plate 214d is formed in the same number as the plurality of switching elements 144d to correspond to the plurality of switching elements 144d, the plurality of heat proof plates 214d are arranged to face each other in a double row, and in this case, insulation between the plurality of heat proof plates 214d may be required.

Accordingly, the second dummy plate 214 may further include an insulating bracket 214e separating the plurality of heat proof plates 214d from each other so that the plurality of heat proof plates 214d are not directly connected to each other.

In addition, the second dummy plate 214 may further include an insulating paper 214f insulating the heat sink 214c from the plurality of heat proof plates 214d so that the plurality of heat proof plates 214d are not indirectly connected to each other through the heat sink 214c. Here, the insulating paper 214f not only performs an insulating function between the plurality of heat proof plates 214d and the heat sink 214c, but also performs a function of improving the heat transfer rate between the plurality of heat proof plates 214d and the heat sink 214c by removing an air gap between the contact surfaces.

Referring to FIGS. 11 and 12, the second inverter manufacturing equipment 220 may be formed in a so-called pallet shape so that a plurality of inverters 140 are mounted on the second inverter manufacturing equipment 220 and soldered at the same time. That is, the second inverter manufacturing equipment 220 may include a mounting pin 222 inserted into the mounting hole 212bb, the mounting pin 222 may be formed in plurality, some of the plurality of mounting pins 222 may be inserted into a mounting hole of a first inverter manufacturing equipment coupled with one inverter among the plurality of inverters 140, and some of the plurality of mounting pins 222 may be inserted into a mounting hole of first inverter manufacturing equipment coupled with another inverter among the plurality of inverters.

The inverter manufacturing equipment 200 according to this configuration may be used for soldering the inverter 140 as illustrated in FIGS. 9 to 14. That is, the plurality of elements 141 may be soldered by the inverter manufacturing equipment 200 according to the inverter manufacturing method illustrated in FIGS. 9 to 14.

Specifically, after the plurality of elements 141 are arranged on the circuit board 142 and the switching element 144d is arranged on the frame 144, the circuit board 142 and the frame 144 may be assembled.

Then, as illustrated in FIG. 9, the guide pin 212aa is inserted into the fastening hole 144g and the inverter 140 may be seated on the first dummy plate 212.

And, as illustrated in FIG. 10, the second dummy plate 214 may be coupled to the first dummy plate 212.

Here, the switching element 144d may be pressed by the heat proof plate 214d, and the array plate 144c together with the switching element 144d may be moved toward the circuit board 142 with respect to the support plate 144a. That is, the connection bar 144b may be deformed, and the relative position of the array plate 144c with respect to the support plate 144a may be changed. Accordingly, the plurality of elements 141 may be pressed by the array plate 144c and fixed to a predetermined position on the circuit board 142. And, due to the restoring force of the connection bar 144b, the switching element 144d and the heat proof plate 214d may be closely contacted and thermally connected. The plurality of elements 141 may be thermally connected to the heat proof plate 214d through the switching element 144d.

And, as illustrated in FIG. 11, an assembly of the inverter 140 and the first inverter manufacturing equipment 210 (hereinafter, assembly) may be mounted on the second inverter manufacturing equipment 220.

Here, the assembly may be prepared in plurality, and the plurality of assemblies may be mounted on one second inverter manufacturing equipment 220.

And, as illustrated in FIG. 12, the plurality of elements 141 of the plurality of assemblies may be simultaneously soldered by a soldering device 300.

Here, being simultaneously soldered may mean not only that all of the plurality of elements 141 of the plurality of assemblies are all simultaneously soldered, but also that some of the plurality of elements 141 of any of the plurality of assemblies are soldered together with some of the plurality of elements 141 of other assemblies among the plurality of assemblies corresponding thereto, as illustrated in FIG. 12.

After soldering is completed, the plurality of assemblies may be removed from the second inverter manufacturing equipment 220.

And, as illustrated in FIG. 13, each of the assemblies may be connected to a tester 400 through the electrical pin to receive a performance test such as whether the plurality of elements 141 and the switching element 144d operate normally.

And, as illustrated in FIG. 14, in each of the assemblies, the second dummy plate 214 may be separated from the first dummy plate 212 and the inverter 140 may be withdrawn from the first dummy plate 212. That is, the inverter 140 is removed from the inverter manufacturing equipment 200, and soldering of the inverter 140 may be completed.

Here, in the electric compressor 100, the inverter manufacturing equipment 200 and the inverter manufacturing method according to this embodiment, the inverter 140 of the electric compressor 100 includes the fastening hole 144g, the fastening hole 144g is formed to be fastened with the first inverter manufacturing equipment 210 when the inverter 140 is manufactured, and to be fastened with the housing 110 after the inverter 140 is manufactured, the first inverter manufacturing equipment 210 includes the first dummy plate 212 having the guide pin 212aa inserted into the fastening hole 144g and the second dummy plate 214 coupled to the first dummy plate 212 and in contact with the inverter 140, the inverter manufacturing method includes seating the inverter 140 on the first dummy plate 212, coupling the second dummy plate 214 to the first dummy plate 212 to fix the plurality of elements 141 and connecting the plurality of elements 141 and the switching element 144d to the heat proof plate 214d of the second dummy plate 214, and soldering the plurality of elements 141, so that it is possible to prevent the plurality of elements 141 from being separated from a predetermined position, thereby preventing soldering defects.

In addition, the plurality of elements 141 and the switching element 144d are thermally connected to the heat proof plate 214d, and the heat proof plate 214d is thermally connected to the heat sink 214c, so that heat applied to the plurality of elements 141 and the switching element 144d during a soldering process may be radiated through the heat proof plate 214d and the heat sink 214c. Accordingly, it is possible to prevent the switching element 144d from being damaged by heat due to soldering.

In addition, the inverter 140 and the first inverter manufacturing equipment 210 are subjected to a performance test in an assembled state, so that heat generated when the plurality of elements 141 and the switching element 144d are operated in the performance test process may be radiated through the heat proof plate 214d and the heat sink 214c. Accordingly, it is possible to prevent the inverter 140 from being damaged due to heat generated by the plurality of elements 141 and the switching element 144d (particularly, the switching element 144d with high heat generation) during the performance test.

In addition, as the frame 144 of the inverter 140 includes the support plate 144a, the array plate 144c and the connection bar 144b, and the first inverter manufacturing equipment 210 is formed such that the heat proof plate 214d press the switching element 144d to move the array plate 144c toward the circuit board 142, the heat proof plate 214d and the switching element 144d may be in close contact with each other. Accordingly, heat transfer between the heat proof plate 214d and the switching element 144d may be stably and smoothly performed.

In addition, as the degree to which the heat proof plate 214d presses the switching element 144d is set to be equal to the degree to which the housing 110 presses the switching element 144d when the inverter 140 is mounted on the housing 110, the stress applied to the plurality of elements 141 and the switching element 144d during soldering may be equal to the stress applied to the plurality of elements 141 and the switching element 144d after soldering (after the inverter 140 is mounted to the housing 110). Accordingly, it is possible to prevent damage to the soldered portions of the plurality of elements 141 due to a difference in stress applied to the plurality of elements 141 and the switching element 144d.

Meanwhile, in the present embodiment, the plurality of inverters 140 are simultaneously soldered to form the plurality of assemblies to be seated on one second inverter manufacturing equipment 220 to improve productivity, but the present disclosure is not limited thereto. That is, one assembly may be seated on the second inverter manufacturing equipment 220 and soldered, or the assembly may be directly soldered without being seated on the second inverter manufacturing equipment 220.

Meanwhile, in the present embodiment, the plurality of assemblies are each subjected to the performance test after being removed from the second inverter manufacturing equipment 220, but the present disclosure is not limited thereto. That is, the plurality of assemblies may be removed from the second inverter manufacturing equipment 220 after receiving the performance test while seated on the second inverter manufacturing equipment 220.

The invention claimed is:

1. An inverter manufacturing equipment comprising:
a first dummy plate fixed to a frame of an inverter having a circuit board on which a plurality of elements of an electric compressor are mounted and the frame on which a switching element is disposed; and
a second dummy plate coupled to the first dummy plate to contact the switching element and to fix and radiate the switching element and the plurality of elements, wherein the second dummy plate comprises a heat proof plate, wherein the heat proof plate is formed in contact with the switching element when the second dummy plate is coupled to the first dummy plate, wherein the frame comprises a support plate, an array plate on which the switching element is arranged, and a connection bar connecting the support plate and the array plate, and wherein the heat proof plate is formed to change a relative position of the array plate with respect to the support plate by pressing the switching element when the second dummy plate is coupled to the first dummy plate, and is formed in close contact with the switching element by a restoring force of the connection bar.

2. The inverter manufacturing equipment of claim 1, wherein the frame comprises a fastening hole coupled to a housing, wherein the first dummy plate comprises a first base plate opposite to the circuit board and a first side plate bent from the first base plate and surrounding an outer periphery of the inverter, wherein the first base plate comprises a guide pin inserted into the fastening hole and an opening exposing the circuit board for soldering, and wherein the first side plate comprises a fixing hole into which a fixture for coupling with the second dummy plate is inserted.

3. An inverter manufacturing equipment comprising:
a first dummy plate fixed to a frame of an inverter having a circuit board on which a plurality of elements of an electric compressor are mounted and the frame on which a switching element is disposed; and
a second dummy plate coupled to the first dummy plate to contact the switching element and to fix and radiate the switching element and the plurality of elements, wherein the frame comprises a fastening hole coupled to a housing, wherein the first dummy plate comprises a first base plate opposite to the circuit board and a first side plate bent from the first base plate and surrounding an outer periphery of the inverter, wherein the first base plate comprises a guide pin inserted into the fastening hole and an opening exposing the circuit board for soldering, wherein the first side plate comprises a fixing hole into which a fixture for coupling with the second dummy plate is inserted, and wherein the first side plate further comprises a mounting hole into which a mounting pin for simultaneously soldering the inverter is inserted.

4. An inverter manufacturing equipment comprising:
a first dummy plate fixed to a frame of an inverter having a circuit board on which a plurality of elements of an electric compressor are mounted and the frame on which a switching element is disposed; and
a second dummy plate coupled to the first dummy plate to contact the switching element and to fix and radiate the switching element and the plurality of elements, wherein the frame comprises a fastening hole coupled to a housing, wherein the first dummy plate comprises a first base plate opposite to the circuit board and a first side plate bent from the first base plate and surrounding an outer periphery of the inverter, wherein the first base plate comprises a guide pin inserted into the fastening hole and an opening exposing the circuit board for soldering, wherein the first side plate comprises a fixing hole into which a fixture for coupling with the second dummy plate is inserted, and wherein the second dummy plate further comprises a second base plate opposite to the frame, a second side plate bent from the second base plate and coupled to the first side plate, a heat sink installed on the second base plate, and a heat proof plate which is heat-exchangeable with the heat sink.

5. An inverter manufacturing equipment comprising:
a first dummy plate fixed to a frame of an inverter having a circuit board on which a plurality of elements of an electric compressor are mounted and the frame on which a switching element is disposed; and
a second dummy plate coupled to the first dummy plate to contact the switching element and to fix and radiate the switching element and the plurality of elements, wherein the second dummy plate comprises a heat proof plate, wherein the heat proof plate is formed in contact with the switching element when the second dummy plate is coupled to the first dummy plate, wherein the switching element is formed in plurality, wherein the heat proof plate is formed in a same number as the switching element, and wherein the second dummy plate comprises an insulating bracket that insulates the heat proof plate from each other.

6. The inverter manufacturing equipment of claim 4, wherein the second dummy plate comprises an insulating paper that insulates the heat sink from the heat proof plate.

* * * * *